(12) United States Patent
Peng et al.

(10) Patent No.: US 11,791,232 B2
(45) Date of Patent: Oct. 17, 2023

(54) PACKAGING STRUCTURE AND PACKAGING METHOD OF DIGITAL CIRCUIT

(71) Applicant: THE 13TH RESEARCH INSTITUTE OF CHINA ELECTRONICS TECHNOLOGY GROUP CORPORATION, Shijiazhuang (CN)

(72) Inventors: Bo Peng, Shijiazhuang (CN); Ling Gao, Shijiazhuang (CN); Xiaojun Zhang, Shijiazhuang (CN); Yang Liu, Shijiazhuang (CN); Qiang Duan, Shijiazhuang (CN); Dapeng Bi, Shijiazhuang (CN); Congge Lu, Shijiazhuang (CN)

(73) Assignee: The 13th Research Institute of China Electronics Technology Group Corporation, Shijiazhuang (CN)

( * ) Notice: Subject to any disclaimer, the term of this patent is extended or adjusted under 35 U.S.C. 154(b) by 486 days.

(21) Appl. No.: 17/188,739

(22) Filed: Mar. 1, 2021

(65) Prior Publication Data
US 2021/0202346 A1 Jul. 1, 2021

Related U.S. Application Data

(63) Continuation of application No. PCT/CN2020/114871, filed on Sep. 11, 2020.

(30) Foreign Application Priority Data

Dec. 27, 2019 (CN) .......................... 201911372577.4

(51) Int. Cl.
*H01L 23/367* (2006.01)
*H01L 23/498* (2006.01)
(Continued)

(52) U.S. Cl.
CPC ...... *H01L 23/3675* (2013.01); *H01L 21/4853* (2013.01); *H01L 21/4882* (2013.01);
(Continued)

(58) Field of Classification Search
CPC . H01L 21/4853; H01L 21/4882; H01L 23/13; H01L 23/15; H01L 23/3675;
(Continued)

(56) References Cited

U.S. PATENT DOCUMENTS 5,881,944 A * 3/1999 Edwards ............ B23K 35/0238
228/56.3
6,292,369 B1 * 9/2001 Daves ..................... H01L 21/50
165/185

(Continued)

FOREIGN PATENT DOCUMENTS

CN 103779285 A 5/2014
CN 105845672 A 8/2016
(Continued)

*Primary Examiner* — Brook Kebede
(74) *Attorney, Agent, or Firm* — AP3 Law Firm PLLC

(57) ABSTRACT

A packaging structure includes: a substrate provided with a through-cavity penetrating up and down, and a metal heat sink on a front surface of the substrate; a bonding chip mounting area and a first passive element mounting area on the front surface, and a flip chip mounting area, a second passive element mounting area and a pin lead mounting area are provided on a back surface of the substrate; a first sealing ring located at the periphery of the bonding chip mounting area and the first passive element mounting area; a first cover plate packaged on the first sealing ring; a second sealing ring located at the periphery of the flip chip mounting area and the second passive element mounting area with the pin lead mounting area being located at the periphery of the second sealing ring; and a second cover plate packaged on the second sealing ring.

10 Claims, 3 Drawing Sheets

(51) Int. Cl.
*H01L 23/13* (2006.01)
*H01L 25/00* (2006.01)
*H01L 21/48* (2006.01)
*H01L 25/16* (2023.01)
*H01L 23/00* (2006.01)
*H01L 23/42* (2006.01)
*H01L 23/373* (2006.01)
*H01L 23/15* (2006.01)

(52) U.S. Cl.
CPC ........ *H01L 23/13* (2013.01); *H01L 23/49811* (2013.01); *H01L 25/165* (2013.01); *H01L 25/50* (2013.01); *H01L 23/15* (2013.01); *H01L 23/3733* (2013.01); *H01L 23/3736* (2013.01); *H01L 23/42* (2013.01); *H01L 23/49838* (2013.01); *H01L 23/49866* (2013.01); *H01L 24/49* (2013.01); *H01L 24/73* (2013.01); *H01L 2224/49109* (2013.01); *H01L 2224/73265* (2013.01); *H01L 2924/19105* (2013.01); *H01L 2924/19106* (2013.01)

(58) Field of Classification Search
CPC . H01L 23/3733; H01L 23/3736; H01L 23/42; H01L 24/49; H01L 23/49811; H01L 23/49838; H01L 23/49866; H01L 24/73; H01L 25/165; H01L 25/50; H01L 2924/19105; H01L 2224/49109; H01L 2224/73265

See application file for complete search history.

(56) References Cited

U.S. PATENT DOCUMENTS

2006/0087009 A1  4/2006  Yang
2015/0187676 A1  7/2015  Won et al.

FOREIGN PATENT DOCUMENTS

CN  107658277 A  2/2018
CN  109411370 A  3/2019

* cited by examiner

PACKAGING STRUCTURE AND PACKAGING METHOD OF DIGITAL CIRCUIT

CROSS-REFERENCE TO RELATED APPLICATIONS

This application is a continuation application of International Application No. PCT/CN2020/114871, filed on Sep. 11, 2020, which claims priority to Chinese Patent Application No. CN201911372577.4, filed on Dec. 27, 2019. The disclosures of the aforementioned applications are hereby incorporated herein by reference in their entireties.

TECHNICAL FIELD

The disclosure belongs to the technical field of integrated circuit packaging and particularly relates to a packaging structure and a packaging method of a digital circuit.

BACKGROUND

The integration technology integrates electronic components with different functions, such as various digital integrated circuits, passive elements, and the like into one complete system, which contains common unit modules such as commonly used data processing, storage, analog-to-digital conversion, digital-to-analog conversion, digital interface, and the like.

At present, with the requirements of high integration, high reliability, and versatility of digital circuits becoming higher and higher, the development of the semiconductor industry in the direction of process improvement and system integration becomes faster and faster. Because the requirements of the flip chip, the bonding chip, and the passive elements for the mechanical performance, the heat dissipation performance, and the air tightness of packaging are different, the existing packaging structure cannot simultaneously meet packaging requirements of the mechanical reliability, the heat dissipation performance and the air tightness of each flip chip, bonding chip, and passive element, so that it is very difficult to integrally package the flip chip, the bonding chip and the passive element with different packaging modes.

SUMMARY

These and other problems are generally solved or circumvented, and technical advantages are generally achieved, by embodiments of the present disclosure which provide a packaging structure and a packaging method of a digital circuit.

Technical Problems

The disclosure provides a packaging structure and a packaging method of a digital circuit and intends to solve the technical problem that a flip chip, a bonding chip, and a passive element cannot be integrally packaged in the prior art.

Technical Solutions

The first aspect of the disclosure provides a packaging structure of a digital circuit. The packaging structure of the digital circuit comprises: a substrate provided with a through-cavity penetrating up and down, the front surface of the substrate is provided with a metal heat sink whose bottom surface is located inside the through-cavity and used for welding or gluing a bonding chip; a bonding chip mounting area and a first passive element mounting area are further provided on the front surface of the substrate, and a flip chip mounting area, a second passive element mounting area, and a pin lead mounting area are provided on the back surface of the substrate; a first sealing ring provided on the front surface of the substrate and located at the periphery of the bonding chip mounting area and the first passive element mounting area; a first cover plate packaged on the first sealing ring, wherein the bottom surface of the first cover plate is glued with the top surface of the metal heat sink through thermally conductive adhesive; a second sealing ring provided on the back surface of the substrate and located at the periphery of the flip chip mounting area and the second passive element mounting area; wherein the pin lead mounting area is located at the periphery of the second sealing ring; and a second cover plate packaged on the second sealing ring, wherein the top surface of the second cover plate is used for gluing with a flip chip through a thermally conductive adhesive.

In one embodiment, the top end of the through-cavity is provided with an inverted step structure, the inverted step structure is provided with more than two step surfaces, and each step surface is used for bonding one layer of bonding wire with the bonding chip located on the bottom surface of the metal heat sink.

In one embodiment, the cross section of the first sealing ring along a height direction thereof is C-shaped, I-shaped, or T-shaped; the cross section of the second sealing ring along the height direction thereof is C-shaped, I-shaped, or T-shaped.

In one embodiment, the bottom surface of the first cover plate is provided with a first thickening layer that protrudes downwards, and the top surface of the metal heat sink is glued with the first thickening layer through thermally conductive adhesive; the top surface of the second cover plate is provided with a second thickening layer that protrudes upwards, and the bottom surface of the flip chip is glued with the second thickening layer through the thermally conductive adhesive.

In one embodiment, a heat conducting gasket is provided between the bottom surface of the first cover plate and the top surface of the metal heat sink; the heat conducting gasket is also provided between the bottom surface of the flip chip and the top surface of the second cover plate.

In one embodiment, the pin lead mounting area may be used to arrange PGA (Pin Grid Array) lead-out end or CCGA (Ceramic Column Grid Array) lead-out end.

In one embodiment, the substrate is made of an aluminum oxide material or aluminum nitride material; the metal heat sink is made of molybdenum copper, tungsten copper, oxygen-free copper, magnetic plastic polymer composite material or ceramic matrix composite material; the first sealing ring, the second sealing ring, the first cover plate, and the second cover plate are made of fernico or iron-nickel alloy.

The second aspect of the disclosure provides a packaging method of a digital circuit used for preparing the packaging structure of the digital circuit. The packaging method of the digital circuit comprises the following steps: manufacturing a corresponding substrate according to a designed layout wiring position, and digging a cavity on a substrate to obtain a through-cavity structure; welding a pin lead at a pin lead mounting area on the back surface of the substrate; welding a metal heat sink on the front surface of the substrate, with the bottom surface of the metal heat sink being located in the through-cavity, and the top surface of the metal heat sink protruding upwards from the front surface of the substrate; welding a first sealing ring on the front surface of the substrate; welding a second sealing ring on the back surface of the substrate, with the periphery of the second sealing ring being a pin lead mounting area; carrying out zoned gold plating on the front surface of the substrate in an area enclosed by the first sealing ring to respectively obtain a bonding chip mounting area and a first passive element mounting area; carrying out zoned gold plating on the back surface of the substrate in an area enclosed by the second sealing ring to respectively obtain a flip chip mounting area and a second passive element mounting area; carrying out gold plating on the back surface of the substrate in the pin lead mounting area; welding or gluing a bonding chip on the bottom surface of the metal heat sink, and correspondingly welding or gluing the bonding chip, the first passive element, the flip chip, and the second passive element in each corresponding area respectively; respectively bonding each bonding chip with the substrate; and packaging the first cover plate on the first sealing ring and packaging the second cover plate on the second sealing ring with the top surface of the metal heat sink being glued with the bottom surface of the first cover plate through thermally conductive adhesive and the bottom surface of the flip chip being glued with the top surface of the second cover plate through the thermally conductive adhesive.

In one embodiment, the gold plating thickness of the first passive element mounting area, the second passive element mounting area, and the flip chip mounting area is less than 0.5 μm; the gold plating thickness of the bonding chip mounting area and the pin lead mounting area is greater than 1.3 μm.

In one embodiment, the metal heat sink, the first sealing ring, and the second sealing ring are respectively welded on the substrate through silver-copper solder; parallel sealing and welding is carried out on the first cover plate and the first sealing ring, and parallel sealing and welding is carried out on the second cover plate and the second sealing ring.

Advantageous Effects of the Disclosure

According to the packaging structure of the digital circuit of the disclosure, because the metal heat sink is provided on the front surface of the substrate, the bottom surface of the metal heat sink is located in the through-cavity, and the bonding chip with more than two bonding layers is welded or glued on the bottom surface of the metal heat sink, the bonding chip is enabled to be located in the through-cavity such that on one hand, the increase of the packaging thickness caused by the large thickness of the bonding chip with more than two bonding layers can be avoided, and on the other hand, the metal heat sink can transfer the high temperature of the bonding chip to the first cover plate for efficient heat dissipation, thereby ensuring that the bonding chip has good heat dissipation performance.

The bonding chip mounting area and the first passive element mounting area are provided on the front surface of the substrate; the second passive element mounting area and the flip chip mounting area are provided on the back surface of the substrate, because the heating value of the flip chip is large, the bottom surface of the flip chip is glued with the second cover plate through the thermally conductive adhesive, the heat of the flip chip can be quickly transferred to the second cover plate for high-efficiency heat dissipation, and the flip chip is ensured to have good heat dissipation performance.

The first sealing ring is arranged on the front surface of the substrate and is located at the periphery of the bonding chip mounting area and the first passive element mounting area, and the bonding chip and the first passive element can be hermetically sealed by packaging the first cover plate on the first sealing ring.

The second sealing ring is arranged on the back surface of the substrate and is located at the periphery of the flip chip mounting area and the second passive element mounting area, and the flip chip and the second passive element can be hermetically sealed by packaging the second cover plate on the second sealing ring.

The pin lead mounting area is provided on the back surface of the substrate at the periphery of the second sealing ring such that the pin lead is conveniently used as a lead-out end and the mechanical reliability is high.

The packaging structure of the digital circuit of the disclosure can be compatible with the flip chip, the bonding chip, and the passive element at the same time so that the integrated packaging of multiple different chips and passive elements can be realized, and the good heat dissipation performance, mechanical reliability and packaging air tightness of each chip and passive element can be ensured at the same time.

The packaging method of the digital circuit provided by the disclosure has the same beneficial effects as the packaging structure of the digital circuit, and will not be described in detail herein.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
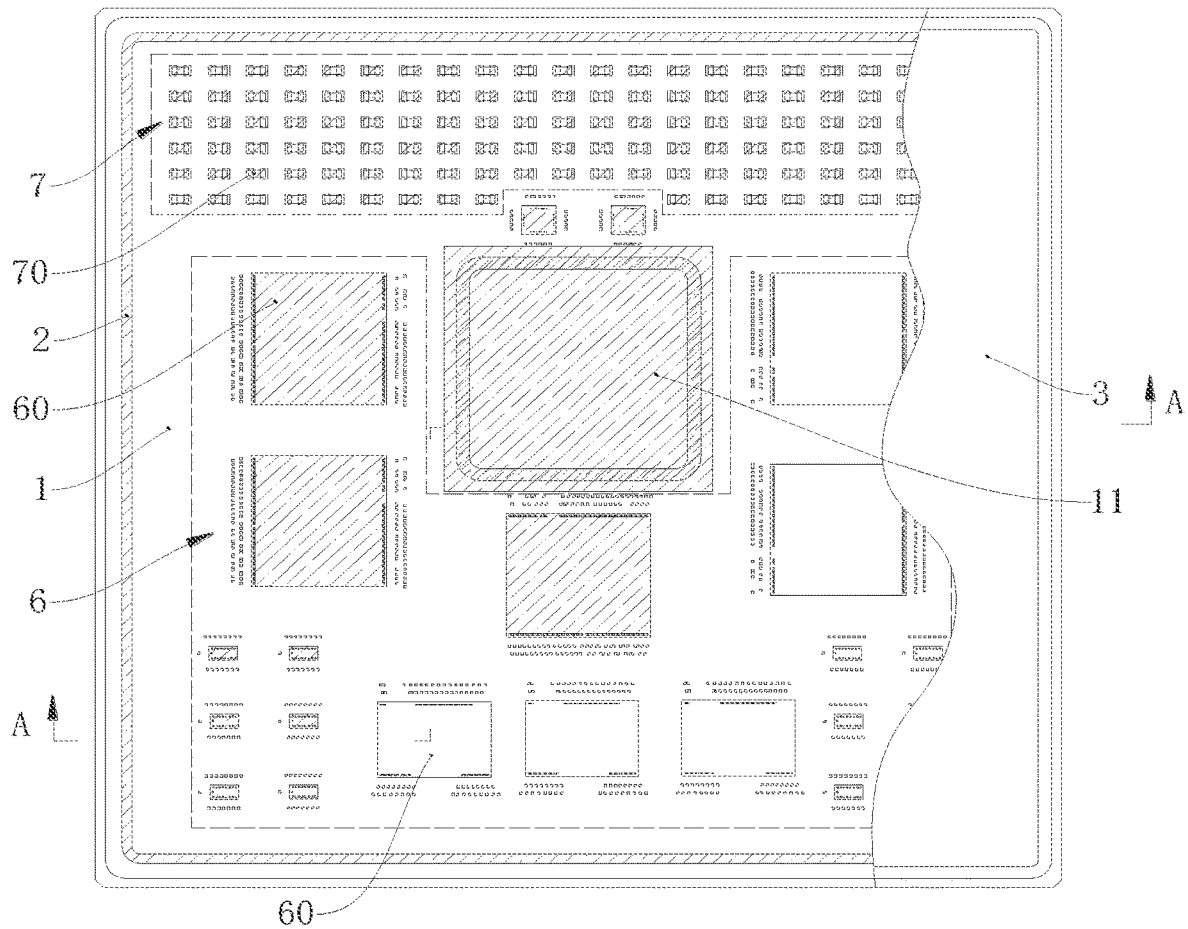
FIG. 1 is a schematic view of a front surface structure of a packaging structure of a digital circuit provided by an embodiment of the disclosure.

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In order to make clearer the technical problems, technical solutions, and beneficial effects to be solved by the disclosure, the following further describes the disclosure in detail with reference to the accompanying drawings and embodiments. It is to be understood that the specific embodiments described herein are merely illustrative of the disclosure and are not intended to be limiting thereof.

In one embodiment, referring to FIGS. 1-4 for a specific implementation of a packaging structure of a digital circuit provided by the disclosure, the packaging structure of the digital circuit comprises a substrate 1, a first sealing ring 2, a first cover plate 3, a second sealing ring 4 and a second cover plate 5; the substrate 1 is provided with a through-cavity 10 penetrating up and down, and the front surface of the substrate 1 is provided with a metal heat sink 11 whose bottom surface is located inside the through-cavity 10 and used for welding or gluing a bonding chip 60; a bonding chip mounting area 6 and a first passive element mounting area 7 are further provided on the front surface of the substrate 1, and a flip chip mounting area 8, a second passive element mounting area 9 and a pin lead mounting area 14 are provided on the back surface of the substrate 1; the first sealing ring 2 is provided on the front surface of the substrate 1 and is located at the periphery of the bonding chip mounting area 6 and the first passive element mounting area 7; the first cover plate 3 is packaged on the first sealing ring 2, and the bottom surface of the first cover plate 3 is glued with the top surface of the metal heat sink 11 through thermally conductive adhesive; the second sealing ring 4 is provided on the back surface of the substrate 1 and is located at the periphery of the flip chip mounting area 8 and the second passive element mounting area 9, and a pin lead mounting area 14 is located at the periphery of the second sealing ring 4; the second cover plate 5 is packaged on the second sealing ring 4 and the top surface of the second cover plate 5 is used for gluing with the flip chip 80 through thermally conductive adhesive.

The disclosure provides a connection mode of the packaging structure of the digital circuit as follows: the metal heat sink 11 is provided on the front surface of the substrate 1, the bottom surface of the metal heat sink 11 is located in the through-cavity 10, and the bonding chip 60 with more than two bonding layers is welded or glued on the bottom surface of the metal heat sink 11, enabling the bonding chip 60 to be located in the through-cavity 10 such that on one hand, the increase of the packaging thickness caused by the large thickness of the bonding chip 60 with more than two bonding layers can be avoided, and on the other hand, the metal heat sink 11 can transfer the high temperature of the bonding chip 60 to the first cover plate 3 for efficient heat dissipation, thereby ensuring that the bonding chip 60 has good heat dissipation performance.

The bonding chip mounting area 6 and the first passive element mounting area 7 are provided on the front surface of the substrate 1; the second passive element mounting area 9 and the flip chip mounting area 8 are provided on the back surface of the substrate 1, it is noted that the bonding chip 60 with two or less bonding layers is mounted in the bonding chip mounting area 6, and the packaging thickness is not influenced because the bonding chip 60 is mounted on the front surface of the substrate with a small thickness; the heating value of the flip chip 80 is large so that the bottom surface of the flip chip 80 is glued with the second cover plate 5 through the thermally conductive adhesive, the heat of the flip chip 80 can be quickly transferred to the second cover plate 5 for high-efficiency heat dissipation, and the flip chip 80 is ensured to have good heat dissipation performance.

The first sealing ring 2 is arranged on the front surface of the substrate 1 and is located at the periphery of the bonding chip mounting area 6 and the first passive element mounting area 7, and the bonding chip 60 and the first passive element 70 can be hermetically sealed by packaging the first cover plate 3 on the first sealing ring 2.

The second sealing ring 4 is arranged on the back surface of the substrate 1 and is located at the periphery of the flip chip mounting area 8 and the second passive element mounting area 9, and the flip chip 80 and the second passive element 90 can be hermetically sealed by packaging the second cover plate 5 on the second sealing ring 4.

The pin lead mounting area 14 is provided on the back surface of the substrate 1 at the periphery of the second sealing ring 4 such that the pin lead 140 is conveniently used as a lead-out end suitable for a lead-out end pitch range of 0.3~5.08 mm, the present application range is wide, and the mechanical reliability is high.

Compared with the prior art, the packaging structure of the digital circuit provided by the disclosure can be compatible with the flip chip 80, the bonding chip 60, and the passive element at the same time, so that the integrated packaging of multiple different chips and passive elements can be realized, and the good heat dissipation performance, mechanical reliability and packaging air tightness of each chip and passive element can be ensured at the same time.

Through reasonable layout and wiring of the front surface and the back surface of the substrate 1, the flip chip 80 within one hundred pieces, the bonding chip 60 within three hundred pieces and the passive elements within ten thousand pieces can be integrally packaged; after integrated packaging, the overall shape is featured with a length and width of no more than 150 mm, and a thickness of no more than 20 mm, such that the packaging structure is small and the integration degree is high.

Figure 2:
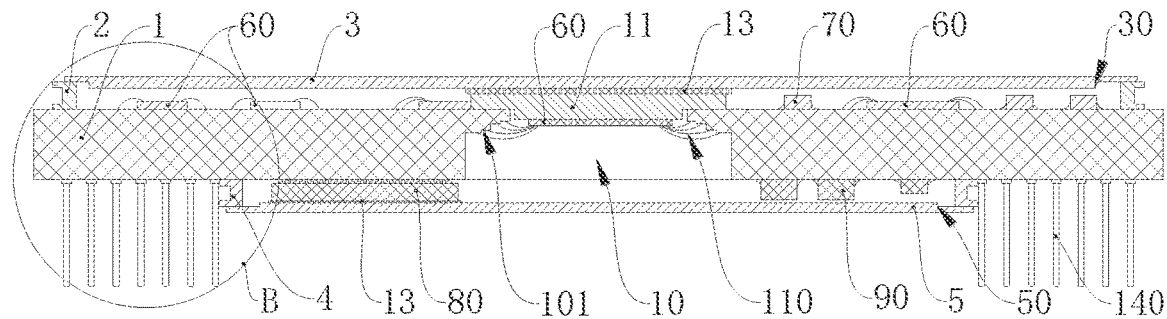
FIG. 2 is a schematic view showing a cross section structure taken along line A-A of FIG. 1.

As a specific embodiment of the packaging structure of the digital circuit provided by the disclosure, referring to FIG. 2, the top end of the through-cavity 10 is provided with an inverted step structure 101, the inverted step structure 101 is provided with more than two step surfaces, and each step surface is used for bonding one layer of bonding wire 110 with the bonding chip 60 located on the bottom surface of the metal heat sink 11.

It should be noted that the bonding chip 60 located on the bottom surface of the metal heat sink 11 generally has a bonding layer with more than two layers, and the number of step surfaces that the inverted step structure 101 arranged on the top end of the through-cavity 10 has corresponds to the number of bonding layers of the bonding chip 60, thereby ensuring that each layer of the bonding wire 110 is bonded to the corresponding step surface. By utilizing the progressive shape of the inverted step structure 101, each bonding layer of the bonding chip 60 can be conveniently bonded layer by layer.

Figure 4:
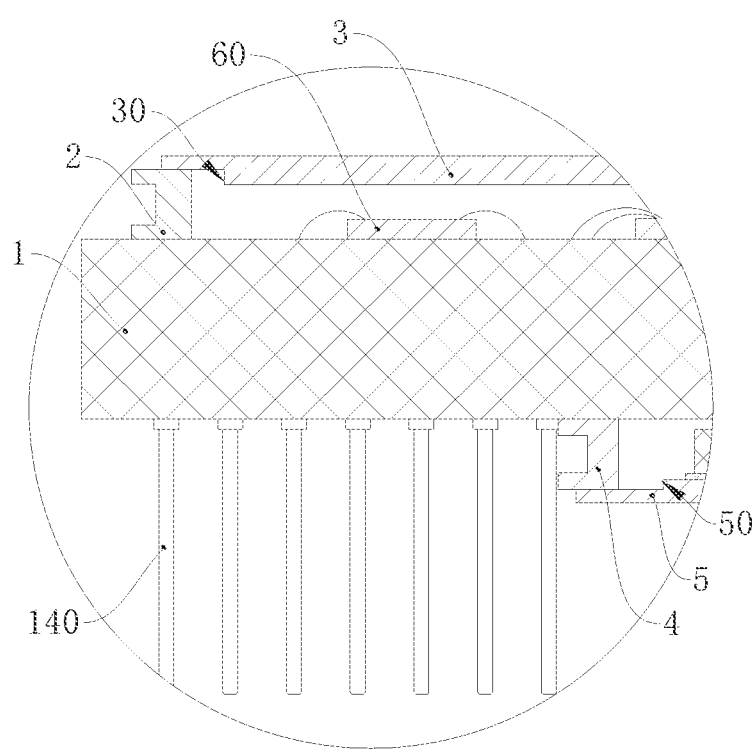
FIG. 4 is a schematic view of a partially enlarged structure at B in FIG. 2.

As a specific embodiment of the disclosure, referring to FIGS. 2 and 4, the first sealing ring 2 is C-shaped, I-shaped, or T-shaped in cross section along height direction thereof; the second sealing ring 4 is C-shaped, I-shaped, or T-shaped in cross section along the height direction thereof.

In the embodiment, a C-shaped structure is selected for illustration. Because the materials of the first sealing ring 2 and the second sealing ring 4 are different from those of the first cover plate 3 and the second cover plate 5, the expansion coefficients are also different. When the temperature changes, thermal stress exists between the first sealing ring 2 and the second sealing ring 4, and the substrate 1. According to the disclosure, the first sealing ring 2 and the second sealing ring 4 with a C-shaped structure in cross section along the height direction thereof are adopted. On one hand, the contact area between the first sealing ring 2 and the front surface of the substrate 1 and between the second sealing ring 4 and the back surface of the substrate 1 can be increased, the thermal stress is reduced, and the connection strength is improved. On the other hand, the structural strength of the first sealing ring 2 and the second sealing ring 4 can be improved, so that the phenomenon of ceramic cracking and air leakage caused by the thermal stress is avoided, and the good air tightness of packaging is ensured.

As a specific embodiment of the disclosure, referring to FIGS. 2 and 4, the bottom surface of the first cover plate 3 is provided with a first thickening layer 30 protruding downwards, and the top surface of the metal heat sink 11 is glued with the first thickening layer 30 through the thermally conductive adhesive; the top surface of the second cover plate 5 is provided with a second thickening layer 50 protruding upwards, and the bottom surface of the flip chip 80 is glued with the second thickening layer 50 through the thermally conductive adhesive.

To meet the requirement of parallel sealing and welding, the edge of the first cover plate 3 and the edge of the second cover plate 5 usually have a thickness of 0.1-0.15 mm, and the strength is low. By arranging the first thickening layer 30 and the second thickening layer 50, the thickness of the middle area of the first cover plate 3 and the middle area of the second cover plate 5 can be increased, so that the strength of the first cover plate 3 and the strength of the second cover plate 5 are improved, and the first cover plate 3 and the second cover plate 5 are prevented from collapsing in the pressurizing test process.

As a specific embodiment of the disclosure, referring to FIG. 2, a heat conducting gasket 13 is provided between the bottom surface of the first cover plate 3 and the top surface of the metal heat sink 11; a heat conducting gasket 13 is also provided between the bottom surface of the flip chip 80 and the top surface of the second cover plate 5. Through the heat conducting gasket 13, the heat of the metal heat sink 11 can be rapidly transferred to the first cover plate 3 and the heat of the flip chip 80 is rapidly transferred to the second cover plate 5 so that the heat dissipation performance of the bonding chip 60 and the flip chip 80 is improved.

As one specific embodiment of the disclosure, pin lead mounting area 14 may be used to arrange PGA (Pin Grid Array) lead-out end or CCGA (Ceramic Column Grid Array) lead-out end. The two lead-out modes have high mechanical reliability and can ensure reliable and stable mounting.

As a specific embodiment of the disclosure, the substrate 1 is of an aluminum oxide material or aluminum nitride material; the metal heat sink 11 is made of molybdenum copper, tungsten copper, oxygen-free copper, magnetic plastic polymer composite material, or ceramic matrix composite material; the first sealing ring 2, the second sealing ring 4, the first cover plate 3 and the second cover plate 5 are fernico or iron-nickel alloy.

Figure 3:
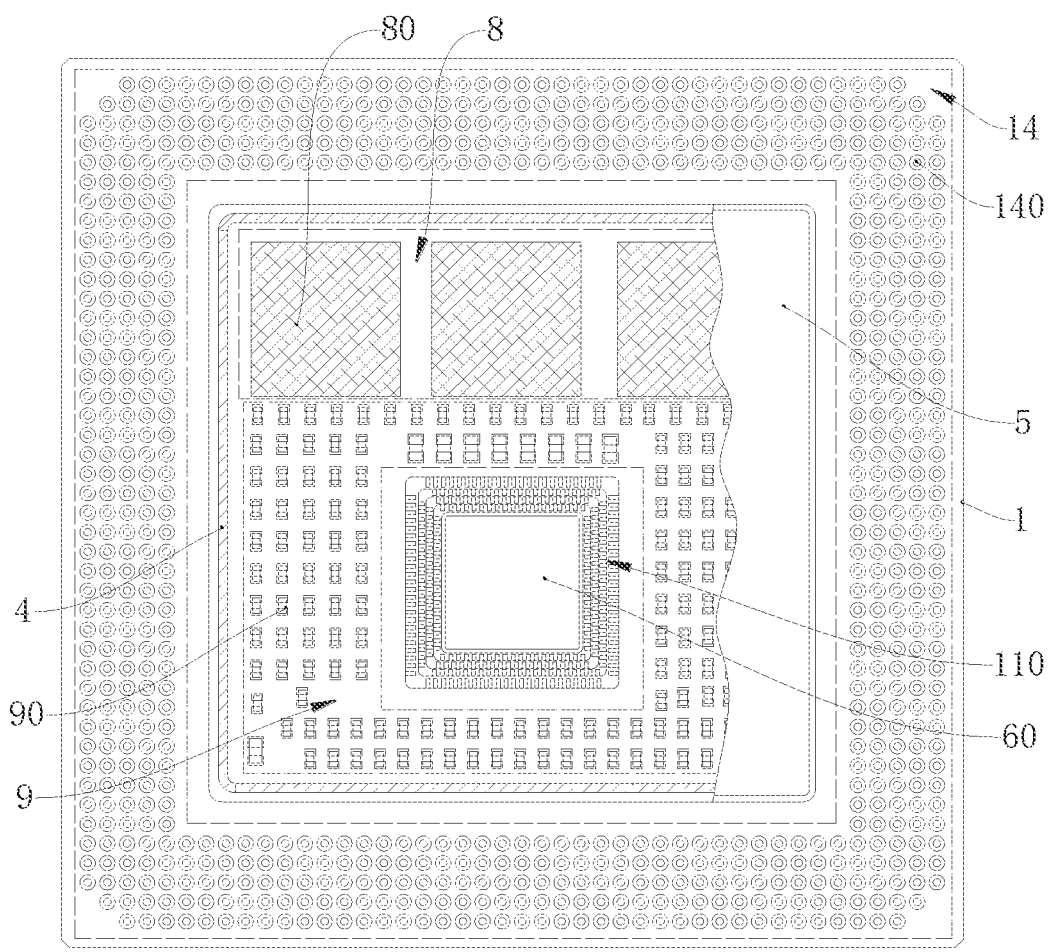
FIG. 3 is a schematic view of a bottom structure of FIG. 2.

The disclosure also provides a packaging method of a digital circuit. Referring to FIGS. 1 to 3, the method comprises the following steps: manufacturing a corresponding substrate 1 according to a designed layout wiring position, and digging a cavity on a substrate 1 to obtain a through-cavity 10 structure; welding a pin lead 140 at a pin lead mounting area 14 on the back surface of the substrate 1; welding a metal heat sink 11 on the front surface of the substrate 1, with the bottom surface of the metal heat sink 11 being located in the through-cavity 10, and the top surface of the metal heat sink 11 protruding upwards from the front surface of the substrate 1; welding a first sealing ring 2 on the front surface of the substrate 1; welding a second sealing ring 4 on the back surface of the substrate 1, with the periphery of the second sealing ring 4 being a pin lead mounting area 14; carrying out zoned gold plating on the front surface of the substrate 1 in an area enclosed by the first sealing ring 2 to respectively obtain a bonding chip mounting area 6 and a first passive element mounting area 7; carrying out zoned gold plating on the back surface of the substrate 1 in an area enclosed by the second sealing ring 4 to respectively obtain a flip chip mounting area 8 and a second passive element mounting area 9; carrying out gold plating on the back surface of the substrate 1 in the pin lead mounting area 14; welding or gluing a bonding chip 60 on the bottom surface of the metal heat sink 11, and correspondingly welding or gluing the bonding chip 60, the first passive element 70, the flip chip 80 and the second passive element 90 in each corresponding area respectively; respectively bonding each bonding chip 60 with the substrate 1; and packaging the first cover plate 3 on the first sealing ring 2 and packaging the second cover plate 5 on the second sealing ring 4 with the top surface of the metal heat sink 11 being glued with the bottom surface of the first cover plate 3 through the thermally conductive adhesive and the bottom surface of the flip chip 80 being glued with the top surface of the second cover plate 5 through the thermally conductive adhesive.

The packaging method of the digital circuit provided by the disclosure has the same beneficial effects as the packaging structure of the digital circuit, and will not be described in detail herein.

As a specific embodiment of the packaging method of the digital circuit provided by the disclosure, referring to FIGS. 1 and 3, the gold plating thickness of the first passive element mounting area 7, the second passive element mounting area 9, and the flip chip mounting area 8 is less than 0.5 μm; the gold plating thickness of the bonding chip mounting area 6 and the pin lead mounting area 14 is greater than 1.3 μm.

It is to be noted that the first passive element 70, the second passive element 90, and the flip chip 80 are welded to the substrate 1 using gold-based solder, which is close to the composition of a plating material (gold), so that the mounting area thereof needs to be plated with flash gold (thickness less than 0.5 μm) to facilitate welding; while the lead-tin solder is used for welding the bonding chip 60 and the pin lead 140, and since it is different from the plating material (gold), thick gold plating (thickness greater than 1.3 μm) is required to ensure the welding quality. In the present embodiment, zoned gold plating is used and the thickness of gold plating in each area is matched with the type of solder used for welding in the area, thereby ensuring the stable and reliable welding of each chip or element and improving packaging reliability performance.

As a specific embodiment of the packaging method of the digital circuit provided by the disclosure, referring to FIG. 2, the metal heat sink 11, the first sealing ring 2 and the second sealing ring 4 are respectively welded on the substrate 1 through silver-copper solder; the first cover plate 3 and the first sealing ring 2 are packaged by parallel sealing and welding, and the second cover plate 5 and the second sealing ring 4 are packaged by parallel sealing and welding. The parallel sealing and welding are good in welding air tightness, and are firm and reliable.

The above are only preferred embodiments of the disclosure and are not intended to limit the disclosure. Any modification, equivalent replacement and improvement, and the like made within the spirit and principle of the disclosure shall be included in the protection scope of the present application.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The invention claimed is:

1. A packaging structure, comprising:
a substrate provided with a through-cavity penetrating up and down, wherein a front surface of the substrate is provided with a metal heat sink whose bottom surface is located inside the through-cavity and used for welding or gluing a bonding chip of a digital circuit; a bonding chip mounting area and a first passive element mounting area are further provided on the front surface of the substrate; and a flip chip mounting area, a second passive element mounting area, and a pin lead mounting area are provided on a back surface of the substrate;
a first sealing ring provided on the front surface of the substrate and located at a periphery of the bonding chip mounting area and the first passive element mounting area;
a first cover plate packaged on the first sealing ring, wherein a bottom surface of the first cover plate is glued with a top surface of the metal heat sink through a thermally conductive adhesive;
a second sealing ring provided on the back surface of the substrate and located at the periphery of the flip chip mounting area and the second passive element mounting area; wherein the pin lead mounting area is located at the periphery of the second sealing ring; and
a second cover plate packaged on the second sealing ring, wherein a top surface of the second cover plate is used for gluing with a flip chip of the digital circuit through the thermally conductive adhesive.

2. The packaging structure according to claim 1, wherein a top end of the through-cavity is provided with an inverted step structure, the inverted step structure is provided with more than two step surfaces, and each step surface is used for bonding one layer of a bonding wire with the bonding chip located on the bottom surface of the metal heat sink.

3. The packaging structure according to claim 1, wherein a cross section of the first sealing ring is C-shaped, I-shaped, or T-shaped; and a cross section of the second sealing ring is C-shaped, I-shaped, or T-shaped.

4. The packaging structure according to claim 1, wherein the bottom surface of the first cover plate is provided with a first thickening layer that protrudes downwards, and the top surface of the metal heat sink is glued with the first thickening layer through the thermally conductive adhesive; and the top surface of the second cover plate is provided with a second thickening layer that protrudes upwards, and a bottom surface of the flip chip is glued with the second thickening layer through the thermally conductive adhesive.

5. The packaging structure according to claim 1, wherein a heat conducting gasket is provided between the bottom surface of the first cover plate and the top surface of the metal heat sink, and the heat conducting gasket is provided between a bottom surface of the flip chip and the top surface of the second cover plate.

6. The packaging structure according to claim 1, wherein the pin lead mounting area is used to arrange a Pin Grid Array (PGA) lead-out end or a Ceramic Column Grid Array (CCGA) lead-out end.

7. The packaging structure according to claim 1, wherein the substrate is made of an aluminum oxide material or aluminum nitride material; the metal heat sink is made of molybdenum copper, tungsten copper, oxygen-free copper, magnetic plastic polymer composite material or ceramic matrix composite material; and the first sealing ring, the second sealing ring, the first cover plate, and the second cover plate are made of fernico or iron-nickel alloy.

8. A packaging method, used for preparing a packaging structure of a digital circuit, comprising:
manufacturing a substrate according to a designed layout wiring position for the digital circuit, and making a cavity on the substrate to obtain a through-cavity;
welding a pin lead at a pin lead mounting area on a back surface of the substrate;
welding a metal heat sink on a front surface of the substrate, with a bottom surface of the metal heat sink being located in the through-cavity, and a top surface of the metal heat sink protruding upwards from the front surface of the substrate;
welding a first sealing ring on the front surface of the substrate; welding a second sealing ring on the back surface of the substrate, with the pin lead mounting area located at a periphery of the second sealing ring;
performing zoned gold plating on the front surface of the substrate in an area enclosed by the first sealing ring to respectively obtain a bonding chip mounting area and a first passive element mounting area; performing zoned gold plating on the back surface of the substrate in an area enclosed by the second sealing ring to respectively obtain a flip chip mounting area and a second passive element mounting area; performing gold plating on the back surface of the substrate in the pin lead mounting area;
welding or gluing a bonding chip of the digital circuit on the bottom surface of the metal heat sink, and welding or gluing the bonding chip, a first passive element, a flip chip of the digital circuit, and a second passive element in the bonding chip mounting area, the first passive element mounting area, the flip chip mounting area and the second passive element mounting area, respectively;
bonding the bonding chip with the substrate; and
packaging a first cover plate on the first sealing ring and packaging a second cover plate on the second sealing ring, the top surface of the metal heat sink being glued with a bottom surface of the first cover plate through a thermally conductive adhesive, and the bottom surface of the flip chip being glued with a top surface of the second cover plate through the thermally conductive adhesive.

9. The packaging method according to claim 8, wherein a gold plating thickness of each of the first passive element mounting area, the second passive element mounting area, and the flip chip mounting area is less than 0.5 µm; and the gold plating thickness of each of the bonding chip mounting area and the pin lead mounting area is greater than 1.3 µm.

10. The packaging method according to claim 8, wherein the metal heat sink, the first sealing ring, and the second sealing ring are respectively welded on the substrate through silver-copper solder; and parallel sealing and welding is carried out on the first cover plate and the first sealing ring, and parallel sealing and welding is carried out on the second cover plate and the second sealing ring.

\* \* \* \* \*